(12) United States Patent
Liang et al.

(10) Patent No.: US 11,420,404 B2
(45) Date of Patent: Aug. 23, 2022

(54) MANUFACTURING METHOD OF FLEXIBLE WAVEGUIDE DISPLAY STRUCTURE

(71) Applicant: KDH Design Co., Ltd., British Virgin Island (GB)

(72) Inventors: Wei-Young Liang, Taipei (TW); Chung-Hsien Lu, Taipei (TW)

(73) Assignee: Jarvish Pty Ltd., Victoria (AU)

( * ) Notice: Subject to any disclaimer, the term of this patent is extended or adjusted under 35 U.S.C. 154(b) by 101 days.

(21) Appl. No.: 16/858,721

(22) Filed: Apr. 27, 2020

(65) Prior Publication Data

US 2021/0333467 A1   Oct. 28, 2021

(51) Int. Cl.
| | |
|---|---|
| *B29D 11/00* | (2006.01) |
| *F21V 8/00* | (2006.01) |
| *G02B 27/01* | (2006.01) |
| *C23C 14/34* | (2006.01) |
| *C23C 14/32* | (2006.01) |

(52) U.S. Cl.
CPC .. *B29D 11/00875* (2013.01); *B29D 11/00663* (2013.01); *C23C 14/32* (2013.01); *C23C 14/34* (2013.01); *G02B 6/0055* (2013.01); *G02B 6/0065* (2013.01); *G02B 27/0101* (2013.01); *G02B 2027/0118* (2013.01)

(58) Field of Classification Search
CPC ........ B29D 11/00875; B29D 11/00663; G02B 6/0065; G02B 6/0055; G02B 27/0101; C23C 14/34; C23C 14/32

See application file for complete search history.

(56) References Cited

U.S. PATENT DOCUMENTS

| | | | | | |
|---|---|---|---|---|---|
| 4,306,765 | A | * | 12/1981 | Winzer | G02B 6/29368 385/47 |
| 4,325,605 | A | * | 4/1982 | Winzer | G02B 6/2817 385/44 |
| 4,439,005 | A | * | 3/1984 | Winzer | G02B 6/4201 250/227.24 |

* cited by examiner

*Primary Examiner* — Mathieu D Vargot
(74) *Attorney, Agent, or Firm* — Bradley J. Thorson; DeWitt LLP

(57) ABSTRACT

A manufacturing method of flexible waveguide display structure includes steps of: providing at least one mold, the at least one mold having multiple mold channels inside, a polymer material being filled into the multiple mold channels, after solidified and shaped, multiple flexible waveguide structures being formed; taking the multiple flexible waveguide structures out of the multiple mold channels, each two adjacent flexible waveguide structures of the multiple flexible waveguide structures having two opposite cut faces, an optical guide layer being formed on one of the cut faces; and connecting the opposite cut faces of the multiple flexible waveguide structures with each other to form the flexible waveguide display structure. The manufacturing method of the flexible waveguide display structure is applicable to a device with different curved faces or plane faces to enhance the installation flexibility and the brightness and uniformity of the visible light image.

17 Claims, 5 Drawing Sheets

MANUFACTURING METHOD OF FLEXIBLE WAVEGUIDE DISPLAY STRUCTURE

BACKGROUND OF THE INVENTION

1. Field of the Invention

The present invention relates generally to a manufacturing method of flexible waveguide display structure, and more particularly to a manufacturing method of flexible waveguide display structure, which is applicable to a device with different curved faces or plane faces to enhance the installation flexibility and the brightness and uniformity of the visible light image.

2. Description of the Related Art

In the current AR display, prism reflection means or free-form surface means is generally employed to image the light emitted from a light source in front of the eyes by a certain distance. However, the current glass AR display is totally inflexible and cannot be bent. Therefore, the range of the sight angle (or so-called sight field angle) of the light source image projected and displayed by the current glass AR display is small so that the user's eyes are uneasy to see the projected light source image or the user's eyes can hardly clearly see the light source image or even cannot see the light source image. Moreover, the current glass AR display is totally too heavy so that it cannot be applied to other device (such as intelligent glasses).

It is therefore tried by the applicant to provide a flexible wave guide display device to solve the above problems existing in the conventional device.

SUMMARY OF THE INVENTION

It is therefore a primary object of the present invention to provide a manufacturing method of flexible waveguide display structure, which is applicable to a device with different curved faces or plane faces to enhance the installation flexibility and the brightness and uniformity of the visible light image.

It is a further object of the present invention to provide the above manufacturing method of flexible waveguide display structure, by which the sight angle range of the projected and displayed visible light image seen by a user is enlarged.

To achieve the above and other objects, the manufacturing method of flexible waveguide display structure of the present invention includes steps of: providing at least one mold, the at least one mold having multiple mold channels inside, a polymer material being filled into the multiple mold channels, after solidified and shaped, multiple flexible waveguide structures being formed; taking the multiple flexible waveguide structures out of the multiple mold channels, each two adjacent flexible waveguide structures of the multiple flexible waveguide structures having two opposite cut faces, an optical guide layer being formed on one of the cut faces; and connecting the opposite cut faces of the multiple flexible waveguide structures with each other to form the flexible waveguide display structure. By means of the design of the present invention, the flexible waveguide display structure manufactured by the manufacturing method of the flexible waveguide display structure is applicable to a device with different curved faces or plane faces to enhance the installation flexibility and the brightness and uniformity of the visible light image. In addition, the sight angle range of the projected and displayed visible light image seen by a user is enlarged.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
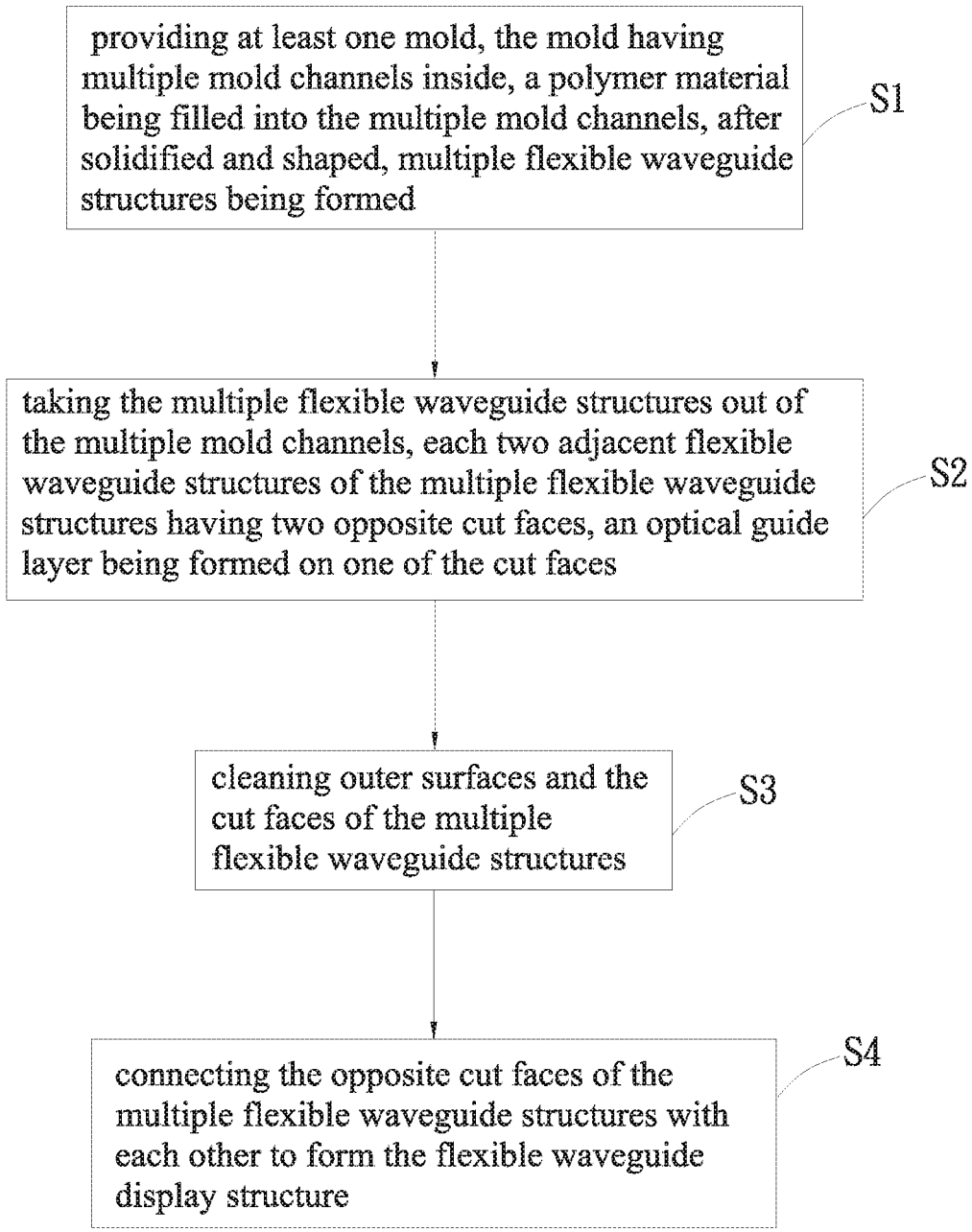
FIG. 1 is a flow chart of a first embodiment of the present invention.
Figure 2:
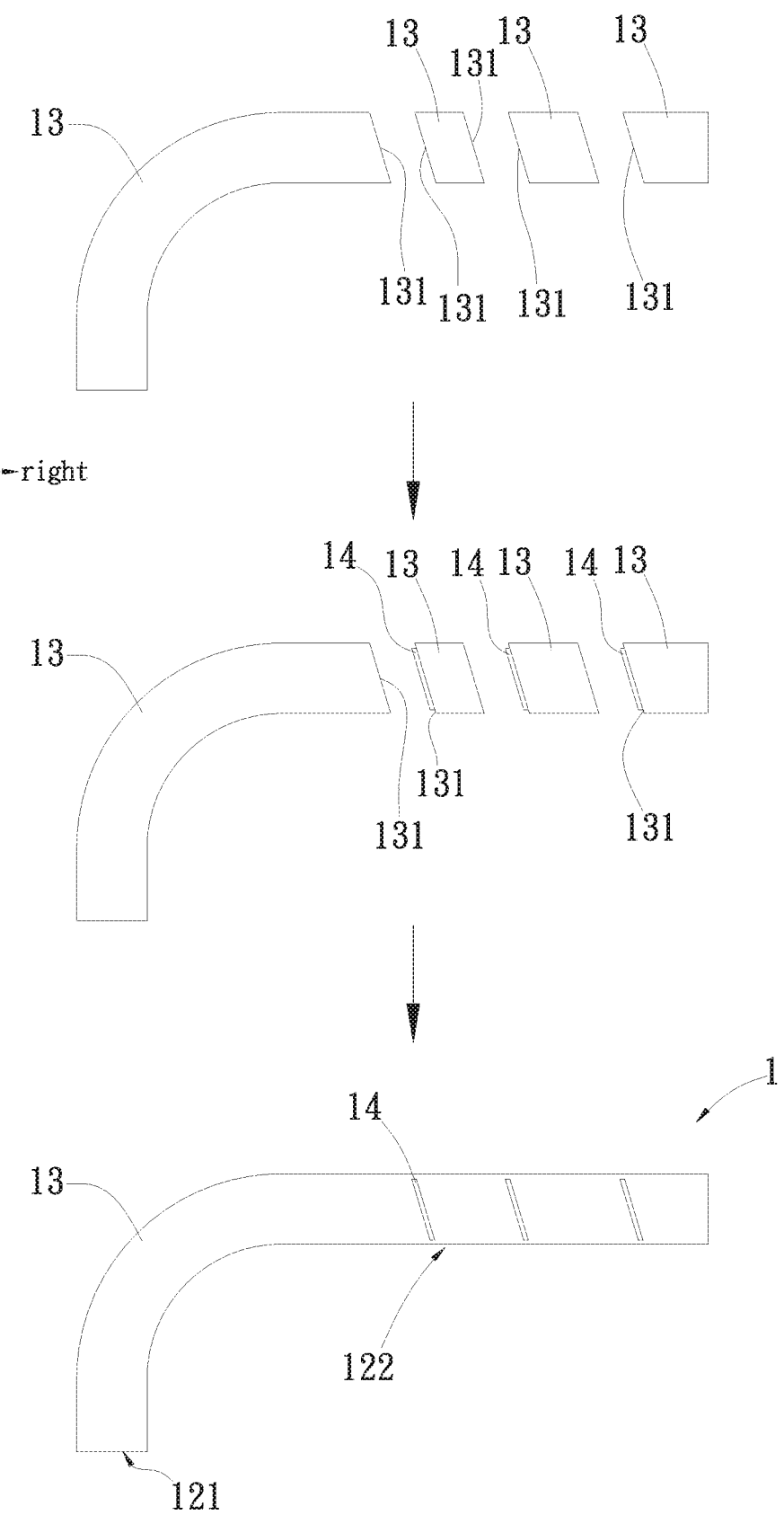
FIG. 2 is a schematic diagram showing the manufacturing steps of the first embodiment of the present invention.
Figure 3:
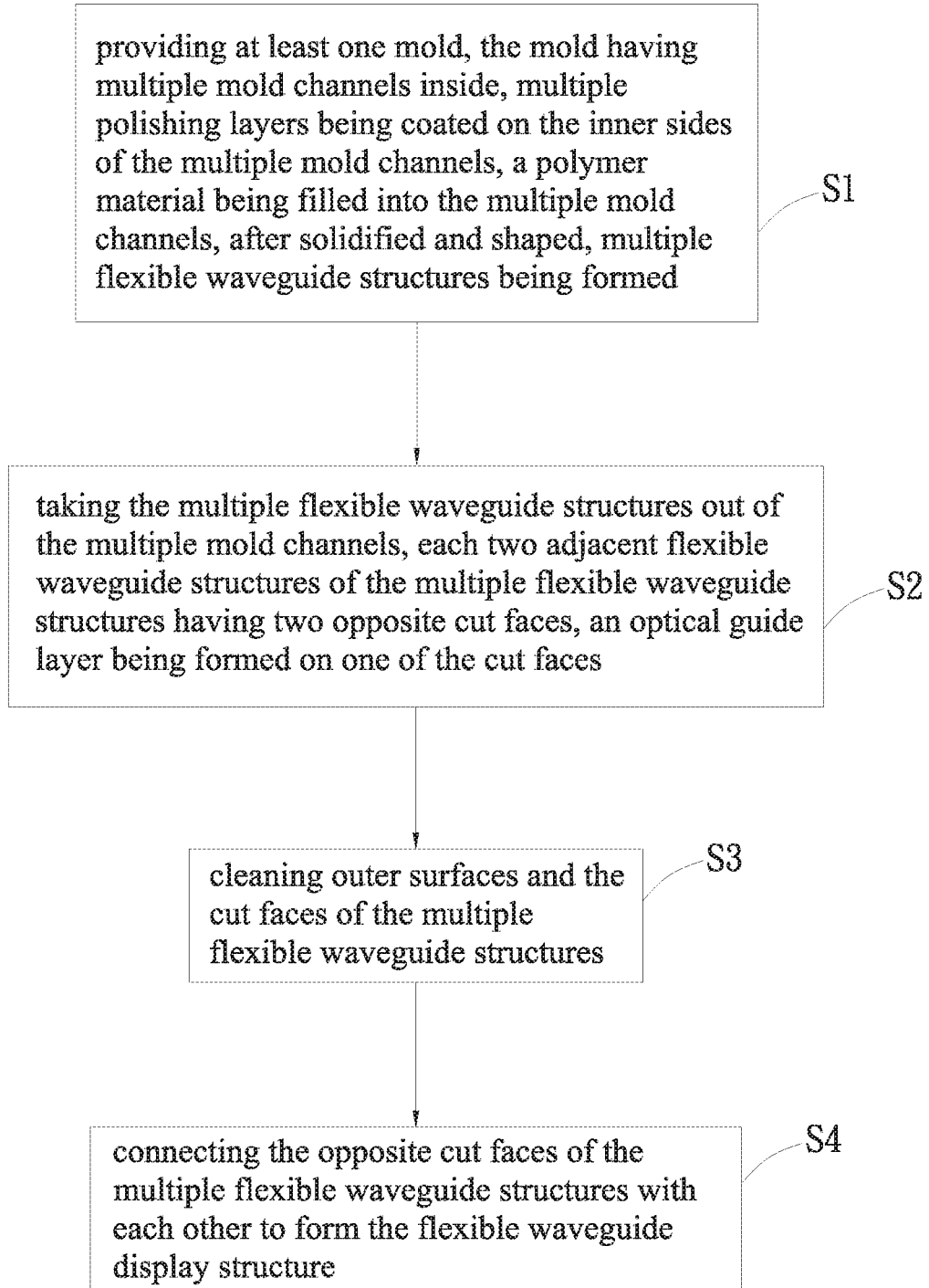
FIG. 3 is a flow chart of a modified embodiment of the first embodiment of the present invention.
Figure 4A:
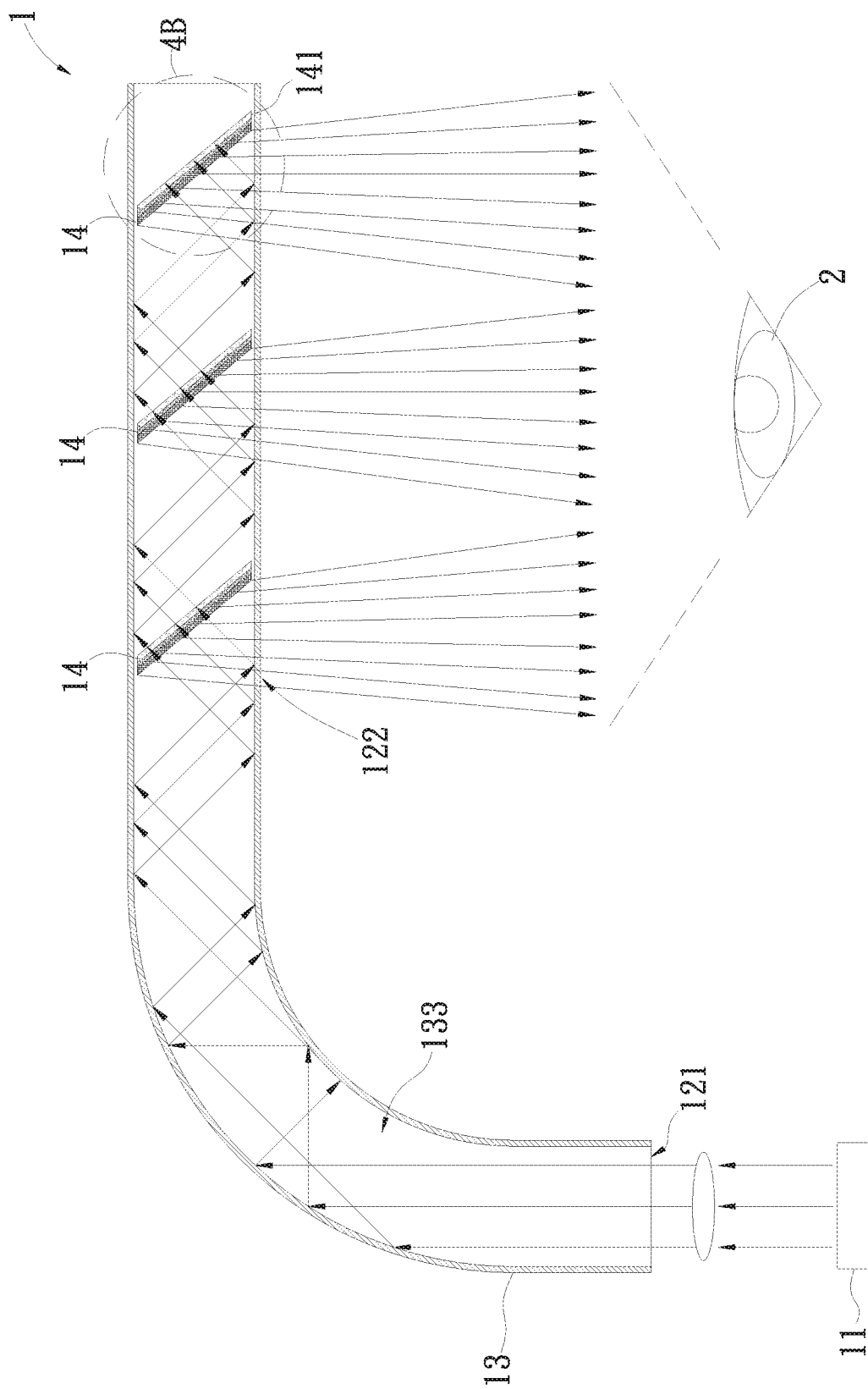
FIG. 4A is a side view of the first embodiment of the flexible wave guide display structure of the present invention.
Figure 4B:
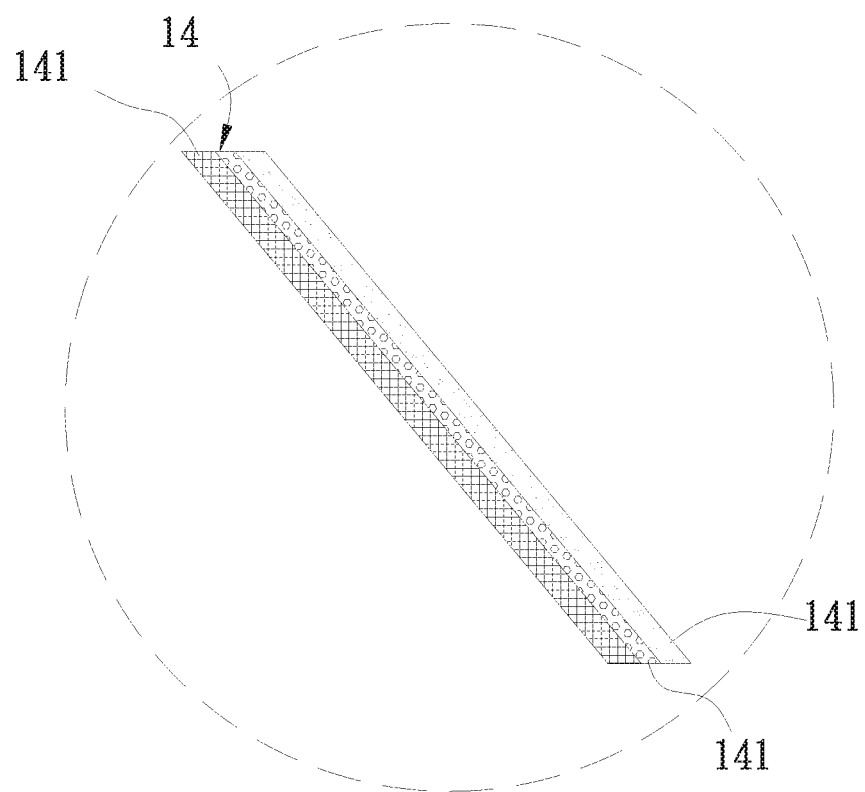
FIG. 4B is an enlarged view of circled area 4B of FIG. 4A, showing the optical guide layer of the present invention.

Please refer to FIGS. 1 to 4B. FIG. 1 is a flow chart of a first embodiment of the present invention. FIG. 2 is a schematic diagram showing the manufacturing steps of the first embodiment of the present invention. FIG. 3 is a flow chart of a modified embodiment of the first embodiment of the present invention. FIG. 4A is a side view of the first embodiment of the flexible wave guide display structure of the present invention. FIG. 4B is an enlarged view of circled area 4B of FIG. 4A, showing the optical guide layer of the present invention. As show in FIGS. 1, 2 and 4A, the flexible waveguide display structure 1 manufactured by means of the manufacturing method of flexible waveguide display structure of the present invention is applicable to a device with different curved faces or plane faces, (such as a helmet, a transportation tool or the like device (such as intelligent glasses)). For example, the flexible waveguide display structure 1 is, but not limited to, applied to a visor of a helmet or a windshield of a vehicle. The manufacturing method of flexible waveguide display structure 1 includes steps of:

S1. providing at least one mold, the at least one mold having multiple mold channels inside, a polymer material being filled into the multiple mold channels, after solidified and shaped, multiple flexible waveguide structures 13 being formed, at least one mold (not shown) being provided, the mold being selectively made by means of 3D printing, casting, plastic injection molding, metal injection molding or other means (such as die casting), the mold having multiple mold channels inside, in this embodiment, there being, but not limited to, four mold channels, the multiple mold channels being recessed and formed on one side of the mold at intervals, then a polymer material such as plastic, polydimethylsiloxane (PDMS), glass, quarts or polyethylene terephthalate (PET) being filled into the multiple mold channels, after the polymer material in the multiple mold channels are solidified and shaped, multiple flexible waveguide structures 13 being formed;

S2. taking the multiple flexible waveguide structures 13 out of the multiple mold channels, each two adjacent flexible waveguide structures 13 of the multiple flexible waveguide structures 13 having two opposite cut faces 131, an optical guide layer 14 being formed on one of the cut faces 131 for receiving a visible light and reflecting and projecting the visible light to outer side so as to form a visible light image, the first, second, third and fourth transparent flexible waveguide structures 13 being sequentially taken out of the first, second, third and fourth corresponding mold channels from the left side to the right side (or the first, second, third and fourth flexible waveguide structures 13 being taken out of the first, second, third and fourth corresponding mold channels at the same time), at this time, the rear end of the first flexible waveguide structure 13 and the front end of the fourth flexible waveguide structure 13 being cut faces 131 in the form of prism, the front and rear ends of the second and third flexible waveguide structures 13 being cut faces 131 in the form of prism, a first optical guide layer 14 being deposited and formed on one of the cut face 131 of the rear end of the first flexible waveguide structure 13 and the opposite cut face 131 of the front end of the second flexible waveguide structure 13, for example, the cut face 131 of the front end of the second flexible waveguide structure 13), a second optical guide layer 14 being deposited and formed on one of the cut face 131 of the rear end of the second flexible waveguide structure 13 and the opposite cut face 131 of the front end of the third flexible waveguide structure 13, for example, the cut face 131 of the front end of the third flexible waveguide structure 13), a third optical guide layer 14 being deposited and formed on one of the cut face 131 of the rear end of the third flexible waveguide structure 13 and the opposite cut face 131 of the front end of the fourth flexible waveguide structure 13, for example, the cut face 131 of the front end of the fourth flexible waveguide structure 13), the area of the first, second and third optical guide layers 14 being smaller than the area of the cut faces 131 of the first, second, third and fourth flexible waveguide structures 13, whereby the peripheries of the first, second and third optical guide layers 14 being smaller than the peripheries of the cut faces 131, the first, second and third optical guide layers 14 being made of metal material such as gold, silver, aluminum or other metal material (such as titanium or copper), the optical guide layers 14 serving to receive a visible light totally reflected in the multiple flexible waveguide structures 13 and reflect and project the visible light to outer side so as to form a visible light image, the aforesaid first, second and third optical guide layers 14 being formed by means of physical vapor deposition (such as vacuum evaporation or sputtering or ion plating) or chemical vapor deposition (such as oxygen plasma), in addition, each of the first, second and third optical guide layers 14 having multiple transflective sections 141, the transflective sections 141 of the first, second and third optical guide layers 14 being stacked and formed on the cut faces 131 of the first, second and third optical guide layers 14, the visible light projected onto the surface of the multiple transflective sections 141 being partially reflected and partially refracted, for example, such as three transflective sections 141 with different thicknesses being formed on one side of each optical guide layer 14, (that is, the first, second and third optical guide layers 14), the thickness of the first transflective section 141 being thinner than the thickness of the second transflective section 141, the thickness of the second transflective section 141 being thinner than the thickness of the third transflective section 141, the thickness of the third transflective section 141 being larger than the thicknesses of the first and second transflective sections 141 as a reflection section, accordingly, the many times totally reflected visible light being transmitted into the first transflective section 141, part of the visible light being reflected and projected from the first transflective section 141 to outer side and part of the visible light passing through the first transflective section 141 and being transmitted to the second transflective section 141, then, part of the visible light being reflected and projected from the second transflective section 141 to outer side and part of the visible light passing through the second transflective section 141 and being transmitted to the third transflective section 141, then the visible light is reflected and projected to outer side by the third transflective section 141 to enter such as a user's eye, (that is, a human eye 2), whereby the human eye 2 can see the projected visible light image;

S3. cleaning outer surfaces and the cut faces 131 of the multiple flexible waveguide structures 13 so as to remove the impurities on the outer surfaces and the cut faces 131 of the multiple flexible waveguide structures 13, the outer surfaces and the cut faces 131 of the first, second, third and fourth flexible waveguide structures 13 being cleaned with such as oxygen plasma so as to remove the impurities on the outer surfaces and the cut faces 131 (including the optical guide layers 14 thereon) of the flexible waveguide structures 13; and S4. connecting the opposite cut faces 131 of the multiple flexible waveguide structures 13 with each other to form the flexible waveguide display structure 1. The opposite cut faces 131 of the first, second, third and fourth flexible waveguide structures 13 made of such as PDMS are connected with each other by means of adhesion or plasma (such as oxygen plasma), whereby the peripheries of the opposite cut faces 131 of the first, second, third and fourth flexible waveguide structures 13 free from the optical guide layer 14 interact with each other so that the first, second, third and fourth flexible waveguide structures 13 are securely attached to and integrally connected with each other to form the flexible waveguide display structure 1. One end of the flexible waveguide display structure 1 is a light incoming end 121 for receiving the visible light emitted from a micro-display 11 such as an organic light-emitting diode (OLED) display. In practice, the micro-display 11 of this embodiment can be alternatively a light-emitting diode (LED) display, a micro light-emitting diode display, an MEMS controlled laser projector, a liquid crystal on silicon (LCoS) projector, a thin film transistor liquid crystal display (TFT-LCD) or a digital light processing (DLP) projector. In this embodiment, the wavelength of the visible light ranges from 380 nm to 750 nm. The visible light is visible by a user's eyes after processed and through the flexible waveguide display structure 1, a visible light image is projected.

The flexible waveguide display structure 1 has a light outgoing end 122 distal from the light incoming end 121 corresponding to the optical guide layers 14. The visible light is totally reflected many times in the flexible waveguide display structure 1 and transmitted to the multiple optical guide layers 14. Then, through the multiple optical guide layers 14, the visible light is reflected and projected to outer side of the light outgoing end 122 to form the visible light image entering the human eye 2.

Accordingly, the human eye 2 can see the visible light image from the outer side of the light outgoing end 122.

Please refer to FIG. 3. In a modified embodiment, in step S1 of providing at least one mold, before the polymer material is filled into the multiple mold channels and solidified and shaped to form the multiple flexible waveguide structures 13, multiple polishing layers are coated on the inner sides of the multiple mold channels, that is, the multiple polishing layers (such as first, second, third and fourth polishing layers) are coated and formed on the inner sides of the first, second, third and fourth corresponding mold channels. Then the polymer material is filled into the multiple mold channels and solidified and shaped to form the multiple flexible waveguide structures 13. Then the steps S2-S4 are sequentially executed to form the flexible waveguide display structure 1. Therefore, by means of the multiple polishing layers coated on the inner sides of the multiple mold channels, the surfaces of the multiple shaped flexible waveguide structures 13 are polished.

Please refer to FIGS. 4A and 4B. FIG. 4A is a side view of the flexible wave guide display structure 1 manufactured by means of the manufacturing method of the flexible wave guide display structure of the present invention. FIG. 4B is an enlarged view of circled area 4B of FIG. 4A, showing the optical guide layer of the present invention. The flexible waveguide display structure 1 includes the light incoming end 121, the light outgoing end 122 outward extending from the light incoming end 121, a light path 133 and the multiple optical guide layers 14. The light path 133 is positioned between the light incoming end 121 and the light outgoing end 122. The visible light emitted from the micro-display 11 is incident upon the light incoming end 121. Then the visible light passes through the light path 133 and is totally reflected many times and transmitted to the multiple optical guide layers 14. Then, through the multiple optical guide layers 14, the visible light is reflected and projected to outer side of the light outgoing end 122, whereby the human eye 2 can see the projected visible light image from the outer side of the light outgoing end 122.

Therefore, the manufacturing method of the flexible waveguide display structure of the present invention is applicable to a device with different curved faces or plane faces to enhance the installation flexibility. Also, by means of the design of the present invention, the visible light image has high brightness and uniformity. Moreover, the sight angle range of the projected and displayed visible light image seen by a user can be enlarged. Also, the total volume is minified.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A manufacturing method for a flexible waveguide display structure, comprising steps of:
   providing at least one mold, the at least one mold having multiple mold channels inside;
   filling the multiple mold channels with a polymer material which when solidified and shaped, forms at least a first flexible waveguide structure and a second flexible waveguide structure, each waveguide structure having front and rear ends;
   taking the first and second flexible waveguide structures out of the multiple mold channels;
   forming an optical guide layer on either the rear end of the first flexible waveguide structure or the front end of the second flexible waveguide structure; and
   connecting the rear end of the first flexible waveguide structure and the front end of the second flexible waveguide structure with each other such that the optical guide layer is deposited in the flexible waveguide display structure for receiving a visible light and reflecting and projecting the visible light to an outer side of the flexible waveguide display structure so as to form a visible light image.

2. The manufacturing method for the flexible waveguide display structure as claimed in claim 1, further comprising a step of cleaning outer surfaces and the ends of the first and second flexible waveguide structures before the step of connecting the opposite ends of the first and second flexible waveguide structures with each other to form the flexible waveguide display structure.

3. The manufacturing method for the flexible waveguide display structure as claimed in claim 2, wherein the cleaning of the outer surfaces and the ends of the first and second flexible waveguide structures includes plasma cleaning.

4. The manufacturing method for the flexible waveguide display structure as claimed in claim 1, wherein in the step of providing at least one mold, multiple polishing layers are coated on inner sides of the multiple mold channels.

5. The manufacturing method for the flexible waveguide display structure as claimed in claim 1, wherein the optical guide layer is formed by means of physical vapor deposition or chemical vapor deposition.

6. The manufacturing method for the flexible waveguide display structure as claimed in claim 5, wherein the physical vapor deposition is vacuum evaporation or sputtering or ion plating.

7. The manufacturing method for the flexible waveguide display structure as claimed in claim 1, wherein the front end of the first flexible waveguide structure is a light incoming end of the flexible waveguide display structure for receiving a visible light, the flexible waveguide display structure further having a light outgoing end distal from the light incoming end corresponding to the optical guide layer, the visible light being totally reflected in the flexible waveguide display structure and transmitted to the optical guide layer, then the visible light is reflected and projected from the optical guide layer to outer side of the light outgoing end to form the visible light image.

8. The manufacturing method for the flexible waveguide display structure as claimed in claim 1, wherein the optical guide layer has multiple transflective sections, the multiple transflective sections being stacked and formed on the flexible waveguide structures.

9. The manufacturing method for the flexible waveguide display structure as claimed in claim 1, wherein the ends of the first and second flexible waveguide structures are connected with each other by means of adhesion or plasma.

10. The manufacturing method for the flexible waveguide display structure as claimed in claim 1, wherein the optical guide layer is made of metal material.

11. The manufacturing method for the flexible waveguide display structure as claimed in claim 1, wherein the ends of the first and second flexible waveguide structures are in the form of a prism.

12. The manufacturing method for the flexible waveguide display structure as claimed in claim 1, wherein the area of the optical guide layers is smaller than the area of the ends of the first and second flexible waveguide structures, whereby the peripheries of the optical guide layer is smaller than the peripheries of the ends.

13. The manufacturing method for the flexible waveguide display structure as claimed in claim 1, wherein peripheries of the ends opposite ends of the first and second flexible waveguide structures are free from the optical guide layer so that the first and second flexible waveguide structures are securely attached to and integrally connected each other.

14. The manufacturing method for the flexible waveguide display structure as claimed in claim 1, further comprising forming a third flexible waveguide structure having front and rear ends and a second optical guide layer formed on either the rear end of the second flexible waveguide structure or the front end of the third flexible waveguide structure, and connecting the rear end of the second flexible waveguide structure and the front end of the third flexible waveguide structure with each other such that the second optical guide layer is deposited in the flexible waveguide display structure.

15. The manufacturing method for the flexible waveguide display structure as claimed in claim 1, further comprising forming a third flexible waveguide structure, and a fourth flexible waveguide structure, each waveguide structure having front and rear ends;
   forming a second optical guide layer on either the rear end of the second flexible waveguide structure or the front end of the third flexible waveguide structure;
   forming a third optical guide layer on either the rear end of the third flexible waveguide structure or the front end of the fourth flexible waveguide structures;
   connecting the rear end of the second flexible waveguide structure and the front end of the third flexible waveguide structure with each other such that the second optical guide layer is deposited in the flexible waveguide display structure; and
   connecting the rear end of the third flexible waveguide structure and the front end of the fourth flexible waveguide structure with each other such that the third optical guide layer is deposited in the flexible waveguide display structure.

16. The manufacturing method for the flexible waveguide display structure as claimed in claim 8, wherein the optical guide layer has a first, second and third transflective sections;
   wherein a thickness of the first transflective section is thinner than a thickness of the second transflective section; and
   wherein the thickness of the second transflective section is thinner than the thickness of the third transflective section.

17. The manufacturing method for the flexible waveguide display structure as claimed in claim 1, wherein the polymer is selected from polydimethylsiloxane (PDMS), or polyethylene terephthalate (PET).

* * * * *

UNITED STATES PATENT AND TRADEMARK OFFICE
CERTIFICATE OF CORRECTION

| | | |
|---|---|---|
| PATENT NO. | : 11,420,404 B2 | Page 1 of 1 |
| APPLICATION NO. | : 16/858721 | |
| DATED | : August 23, 2022 | |
| INVENTOR(S) | : Wei-Young Liang et al. | |

It is certified that error appears in the above-identified patent and that said Letters Patent is hereby corrected as shown below:

On the Title Page

Under "(72) inventors," add the following third inventor:
--Ranjith Rajasekharan Unnithan, Melbourne (AU);--

Signed and Sealed this
Fourth Day of June, 2024

Katherine Kelly Vidal
*Director of the United States Patent and Trademark Office*